US010062052B2

(12) United States Patent
Saylor et al.

(10) Patent No.: US 10,062,052 B2
(45) Date of Patent: *Aug. 28, 2018

(54) ADVANCED LOGISTICS ANALYSIS CAPABILITIES ENVIRONMENT

(71) Applicant: The Boeing Company, Chicago, IL (US)

(72) Inventors: Steven E. Saylor, Auburn, WA (US); Adrienne P. Miller, Kent, WA (US); James K. Dailey, Woodbury, MN (US); Henry Lynn Scheurman, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/176,153

(22) Filed: Jun. 8, 2016

(65) Prior Publication Data

US 2016/0283902 A1    Sep. 29, 2016

Related U.S. Application Data

(63) Continuation of application No. 12/695,672, filed on Jan. 28, 2010, now Pat. No. 9,372,917.

(Continued)

(51) Int. Cl.
*G06F 7/00* (2006.01)
*G06F 17/30* (2006.01)
(Continued)

(52) U.S. Cl.
CPC ..... *G06Q 10/087* (2013.01); *G06F 17/30616* (2013.01); *G06F 17/30675* (2013.01); *G06F 17/5009* (2013.01); *G06Q 10/067* (2013.01)

(58) Field of Classification Search
CPC ........ G06F 17/30616; G06F 17/30675; G06F 17/5009; G06Q 10/067; G06Q 10/087
See application file for complete search history.

(56) References Cited

U.S. PATENT DOCUMENTS 5,953,707 A  *  9/1999  Huang ............... G06Q 10/06
                                                          705/7.25
7,287,231 B2    10/2007  Reichenthal et al.
(Continued)

OTHER PUBLICATIONS

Stranjak et al., "A Multi-Agent Simulation System for Prediction and Scheduling of Aero Engine Overhaul", pp. 1-8, Proc. of 7th International Conference on Autonomous Agents and Multiagent Systems, May 2008, Estoril Portugal.
(Continued)

*Primary Examiner* — Azam Cheema
(74) *Attorney, Agent, or Firm* — Yee & Associates, P.C.

(57) ABSTRACT

The different advantageous embodiments provide a system for modeling supply chain networks comprising a model manager, a node manager, a pipeline manager, a requisitions manager, and a supply control manager. The model manager is configured to initialize a model. The node manager is configured to initialize a number of nodes within the model. The pipeline manager is configured to generate a number of pipeline data objects describing supply chain relationships between a number of nodes. The requisitions manager is configured to generate and receive requests for supplies. The supply control manager is configured to send and receive supplies according to requests for supplies.

18 Claims, 8 Drawing Sheets

Related U.S. Application Data

(60) Provisional application No. 61/251,008, filed on Oct. 13, 2009.

(51) Int. Cl.
  G06Q 10/08 (2012.01)
  G06F 17/50 (2006.01)
  G06Q 10/06 (2012.01)

(56) References Cited

U.S. PATENT DOCUMENTS

| | | | |
|---|---|---|---|
| 9,372,917 | B1 | 6/2016 | Saylor et al. |
| 2002/0129054 | A1* | 9/2002 | Ferguson ............... H04L 29/06 715/212 |
| 2004/0064351 | A1 | 4/2004 | Mikurak |
| 2006/0192053 | A1 | 8/2006 | Crangle |
| 2006/0238919 | A1 | 10/2006 | Bradley |
| 2007/0124009 | A1 | 5/2007 | Bradley |
| 2008/0306783 | A1* | 12/2008 | Yee ........................ G06Q 10/04 705/7.26 |
| 2009/0037299 | A1* | 2/2009 | Powell ................ G06Q 10/087 705/28 |
| 2009/0063550 | A1 | 3/2009 | Van Den Berg |
| 2009/0070322 | A1 | 3/2009 | Salvetti |
| 2010/0070945 | A1 | 3/2010 | Tattrie et al. |
| 2010/0262442 | A1* | 10/2010 | Wingenter ............ G06Q 10/04 705/7.38 |

OTHER PUBLICATIONS

"Enterprise Architecture Review (EAR) Business Architecture", aerogility, Version1.0, Sep. 2008, Lost Wax Media Ltd., pp. 1-19.

"Aerogility System Architecture Overview", aerogility, Version 1.1, Nov. 2007, Lost Wax Media Ltd., pp. 1-17.

"Enterprise Architecture Review (EAR) Aerogility Technology Architecture", aerogility, Version 1, Sep. 2008, Lost Wax Media Ltd., pp. 1-9.

"Aerogility Case Study—Oct. 2007", pp. 1-2, Lost Wax, 2008.

Dang et al., "Aerogility—An intelligent decision support system for managing service-based aftermarkets", 6 Proceedings of 8th International Conference on Autonomous Agents and Multiagent Systems, May 2009, Budapest Hungary, pp. 1411-1412.

Gurvitz et al., "ATLAST Deployment & Push Pack Spares Optimization Module", 2005 IEEE, pp. 55-82.

"Extendsim User guide", 2007 Imagine That Inc., pp. 1-1189.

Connors et al., "Closed-Loop, Simulated-Based, Systems Engineering Approach to Life Cycle Management of Defense Systems", Proceedings of the 2002 Winter Simulation Conference, pp. 893-900.

SIMLOX—Overview, Applications, Version 3 and Version 4, pp. 1-8 retrieved Jan. 2010. http://www.systecon.se/case/C3_SIMILOX/.

Tunon et al., "Design and Use of the CPAN Branch & Bound for the Solution of the Traveling Salesman Problem (TSP);" Electronics, Communications and Computers, 2005, CONIELCOMP, pp. 262-267.

Notice of Allowance, dated Feb. 24, 2016, regarding U.S. Appl. No. 12/695,672 , 6 pages.

Final Office Action, dated Jul. 13, 2012, regarding U.S. Appl. No. 12/695,672 , 17 pages.

Office Action, dated Jan. 30, 2012, regarding U.S. Appl. No. 12/695,672 , 16 pages.

* cited by examiner

ADVANCED LOGISTICS ANALYSIS CAPABILITIES ENVIRONMENT

This application is a continuation application of U.S. application Ser. No. 12/695,672, filed Jan. 28, 2010, now U.S. Pat. No. 9,372,917, which is related to and claims the benefit of priority of provisional U.S. Patent Application Ser. No. 61/251,008 entitled "BALANCE—Boeing Advanced Logistics Analysis Capabilities Environment," filed on Oct. 13, 2009, which is hereby incorporated by reference.

BACKGROUND INFORMATION

1. Field

The present disclosure relates generally to a data processing system and more particularly to supply chain networks. Still more particularly, the present disclosure relates to analysis and modeling to predict supply chain performance in a supply chain network.

2. Background

Operational and support costs of military and commercial aircraft systems typically make up the majority of total ownership costs a customer pays over the life of a system, from initial design to retirement. Design and procurement typically make up the other minority of total ownership costs. Suppliers and customers are increasingly concerned with reducing logistics and operational support costs of products and services, while at the same time assuring required operational and system availabilities levels are met.

Performance-based logistics contracts are increasingly replacing traditional transaction based contracts as a means to improving efficiency and reducing overall costs, holding the service provider responsible for meeting performance measures as negotiated by contract. Under these types of agreements, incentives are paid to the service provider for exceeding required performance levels and penalties are imposed when performance metrics are not met.

Modeling, simulation, and analysis tools provide a means of identifying, assessing, and predicting system performance and associated levels of risk prior to entering contracts. Existing tools focus on inventory stocking level optimization and are limited to supply chain specific aspects of products and services. These tools include a high product cost, and are complex and time-intensive to set up and execute.

Therefore, it is advantageous to have a method and apparatus that takes into account one or more of the issues discussed above, as well as possibly other issues.

SUMMARY

One or more of the different advantageous embodiments provide a system for modeling supply chain networks comprising a model manager, a node manager, a pipeline manager, a requisitions manager, and a supply control manager. The model manager is configured to initialize a model. The node manager is configured to initialize a number of nodes within the model. The pipeline manager is configured to generate a number of pipeline data objects describing supply chain relationships between a number of nodes. The requisitions manager is configured to generate and receive requests for supplies. The supply control manager is configured to send and receive supplies according to requests for supplies.

The different advantageous embodiments further provide a method for modeling supply chain networks. A model is initialized using a model manager. A core database is generated using the model manager. A number of nodes is generated within the model using a number of code objects. A number of pipeline data objects configured to describe supply chain relationships between the number of nodes within the model is generated. A simulation is run using the model to analyze the supply chain relationships. The different advantageous embodiments further provide a method for defining a procurement relationship for replenishing supplies. A pipeline is created for a first node. The pipeline comprises a definition specifying simulation times at which the pipeline is to be evaluated. The pipeline is recorded in a node database for the first node. The pipeline is evaluated according to the definition. A supply requisition is generated based on the evaluation of the pipeline. The supply requisition is transmitted to a second node using a token.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
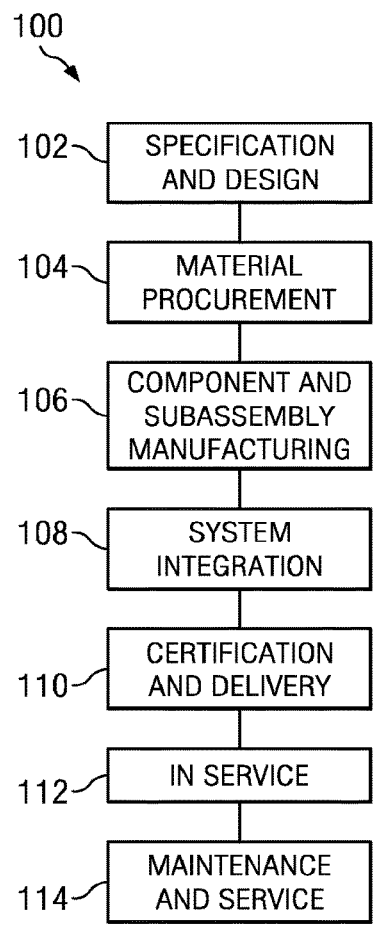
FIG. 1 is an illustration of an aircraft manufacturing and service method in which the advantageous embodiments may be implemented.
Figure 2:
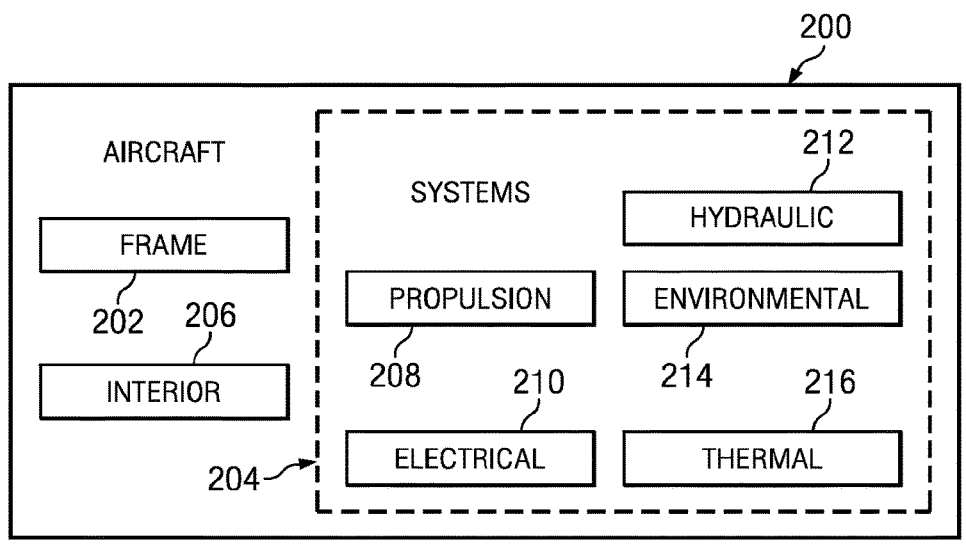
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, environmental system 214, and thermal system 216. Any number of other systems may be included. Although an aerospace example is shown, different advantageous embodiments may be applied to other industries, such as the automotive industry.

Apparatus and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items, means one or more items. For example, a number of apparatus embodiments is one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

The different advantageous embodiments recognize and take into account a number of different considerations. For example, the different advantageous embodiments recognize and take into account that current tools for modeling supply chain performance generally are purchased from a vendor, operate at less level of detail than desired, and typically focus on inventory stocking level optimization. Some current tools use a multi-step, iterative, marginal analysis procedure to determine optimum stocking levels. Other current tools use risk-based algorithms and forecasting to determine optimum stocking levels. Still other current tools use mixed-integer/linear programming combined with a proprietary discrete-event simulation engine to determine optimum stocking levels.

The different advantageous embodiments further recognize and take into account that current tools use analytical methods to solve inventory optimization problems and provide guidance as to recommended inventory levels. These current tools have a high product cost, are complex and time-intensive to set up and execute, and have limited or non-existing capabilities to model non-supply chain specific aspects of a total system architecture.

The different advantageous embodiments further recognize and take into account that current supply chain modeling tools are expensive and complex to set up and run, and lack the capability to easily expand the scope of the simulation to model lower level details about a system design. These limitations create burdens for concept analysts, system engineers, and logistics analysts, who may need to construct a model to analyze and predict supply chain performance, while also addressing aspects of the system impacted by the supply chain, such as maintenance requirements, resource requirements, manufacturing requirements, transportation system design requirements, and the like.

Thus, one or more of the different advantageous embodiments provide a system for modeling supply chain networks comprising a model manager, a node manager, a pipeline manager, a requisitions manager, and a supply control manager. The model manager is configured to initialize a model. The node manager is configured to initialize a number of nodes within the model. The pipeline manager is configured to generate a number of pipeline data objects describing supply chain relationships between a number of nodes. The requisitions manager is configured to generate and receive requests for supplies. The supply control manager is configured to send and receive supplies according to requests for supplies.

The different advantageous embodiments further provide a method for modeling supply chain networks. A model is initialized using a model manager. A core database is generated using the model manager. A number of nodes is generated within the model using a number of code objects. A number of pipeline data objects configured to describe supply chain relationships between the number of nodes within the model is generated. A simulation is run using the model to analyze the supply chain relationships. The different advantageous embodiments further provide a method for defining a procurement relationship for replenishing supplies. A pipeline is created for a first node. The pipeline comprises a definition specifying simulation times at which the pipeline is to be evaluated. The pipeline is recorded in a node database for the first node. The pipeline is evaluated according to the definition. A supply requisition is generated based on the evaluation of the pipeline. The supply requisition is transmitted to a second node using a token.

Figure 3:
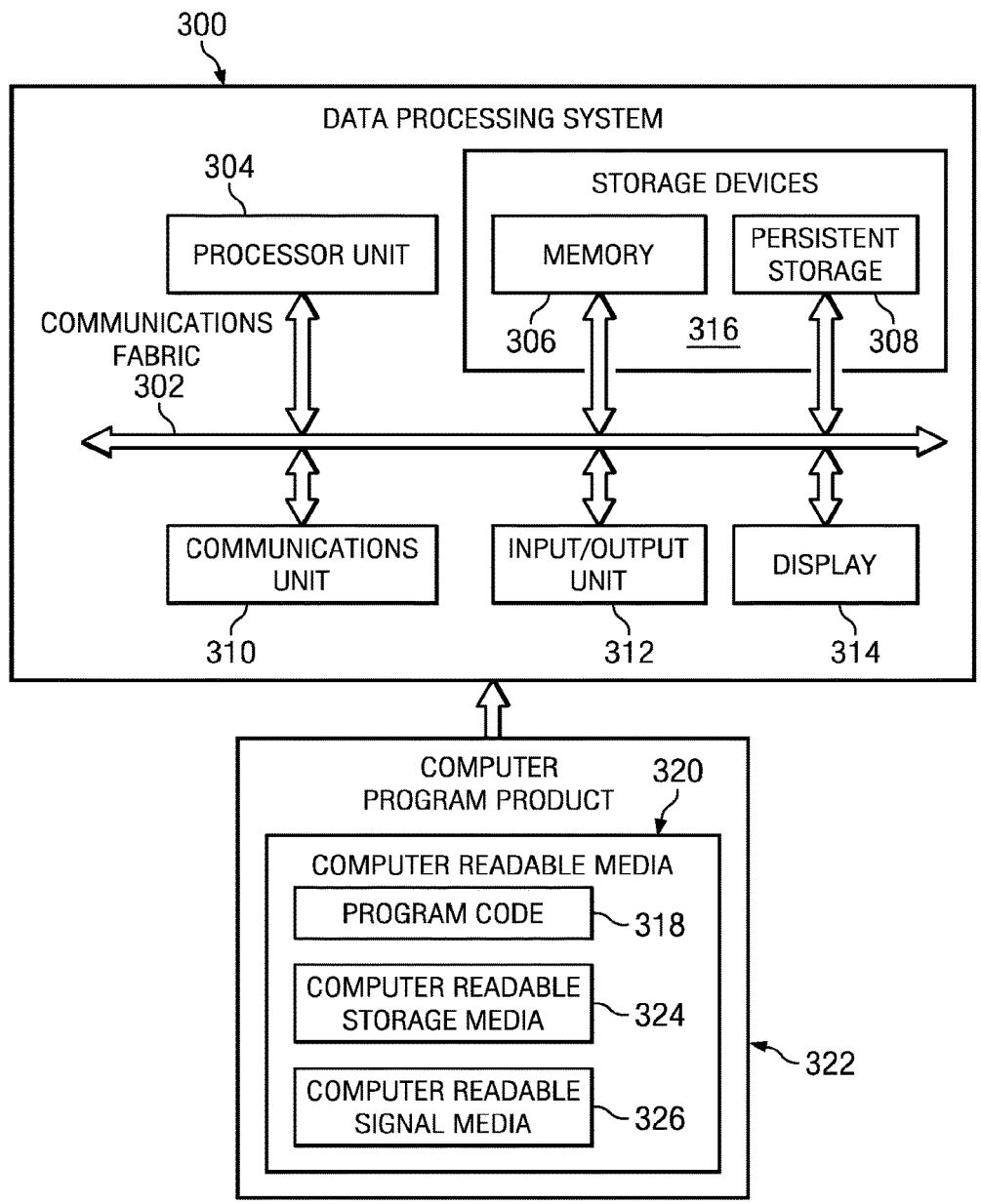
FIG. 3 is an illustration of a data processing system in accordance with an advantageous embodiment.

Turning now to FIG. 3, a diagram of a data processing system is depicted in accordance with an illustrative embodiment. Data processing system 300 may be used to implement processes for modeling supply chain networks in one or more different advantageous embodiments. In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a set of one or more processors or may be a multi-core processor, or multiple central processing units (CPUs), depending on the particular implementation. Further, processor unit 304 may be implemented using one or more heterogeneous processor systems, in which a main processor is present with secondary processors on a single chip. As another illustrative example, processor unit 304 may be a symmetric multi-processor system containing multiple processors of the same type.

Memory 306 and persistent storage 308 are examples of storage devices 316. A storage device is any piece of hardware that is capable of storing information, such as, for example, without limitation, data, program code in functional form, and/or other suitable information either on a temporary basis and/or a permanent basis. Memory 306, in these examples, may be, for example, a random access memory, or any other suitable volatile or non-volatile storage device. Persistent storage 308 may take various forms, depending on the particular implementation. For example, persistent storage 308 may contain one or more components or devices. For example, persistent storage 308 may be a hard drive, flash memory, a rewritable optical disk, a rewritable magnetic tape, or some combination of the above. The media used by persistent storage 308 may be removable. For example, a removable hard drive may be used for persistent storage 308.

Communications unit 310, in these examples, provides for communication with other data processing systems or devices. In these examples, communications unit 310 is a network interface card. Communications unit 310 may provide communications through the use of either or both physical and wireless communications links.

Input/output unit 312 allows for the input and output of data with other devices that may be connected to data processing system 300. For example, input/output unit 312 may provide a connection for user input through a keyboard, a mouse, and/or some other suitable input device. Further, input/output unit 312 may send output to a printer. Display 314 provides a mechanism to display information to a user.

Instructions for the operating system, applications, and/or programs may be located in storage devices 316, which are in communication with processor unit 304 through communications fabric 302. In these illustrative examples, the instructions are in a functional form on persistent storage 308. These instructions may be loaded into memory 306 for execution by processor unit 304. The processes of the different embodiments may be performed by processor unit 304 using computer implemented instructions, which may be located in a memory, such as memory 306.

These instructions are referred to as program code, computer usable program code, or computer readable program code that may be read and executed by a processor in processor unit 304. The program code, in the different embodiments, may be embodied on different physical or computer readable storage media, such as memory 306 or persistent storage 308.

Program code 318 is located in a functional form on computer readable media 320 that is selectively removable and may be loaded onto or transferred to data processing system 300 for execution by processor unit 304. Program code 318 and computer readable media 320 form computer program product 322. In one example, computer readable media 320 may be computer readable storage media 324 or computer readable signal media 326. Computer readable storage media 324 may include, for example, an optical or magnetic disc that is inserted or placed into a drive or other device that is part of persistent storage 308 for transfer onto a storage device, such as a hard drive, that is part of persistent storage 308. Computer readable storage media 324 also may take the form of a persistent storage, such as a hard drive, a thumb drive, or a flash memory that is connected to data processing system 300. In some instances, computer readable storage media 324 may not be removable from data processing system 300.

Alternatively, program code 318 may be transferred to data processing system 300 using computer readable signal media 326. Computer readable signal media 326 may be, for example, a propagated data signal containing program code 318. For example, computer readable signal media 326 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples.

In some illustrative embodiments, program code 318 may be downloaded over a network to persistent storage 308 from another device or data processing system through computer readable signal media 326 for use within data processing system 300. For instance, program code stored in a computer readable storage media in a server data processing system may be downloaded over a network from the server to data processing system 300. The data processing system providing program code 318 may be a server computer, a client computer, or some other device capable of storing and transmitting program code 318.

The different components illustrated for data processing system 300 are not meant to provide architectural limitations to the manner in which different embodiments may be implemented. The different illustrative embodiments may be implemented in a data processing system, including components in addition to or in place of those illustrated for data processing system 300. Other components shown in FIG. 3 can be varied from the illustrative examples shown. The different embodiments may be implemented using any hardware device or system capable of executing program code. As one example, data processing system 300 may include organic components integrated with inorganic components and/or may be comprised entirely of organic components excluding a human being. For example, a storage device may be comprised of an organic semiconductor.

As another example, a storage device in data processing system 300 is any hardware apparatus that may store data. Memory 306, persistent storage 308, and computer readable media 320 are examples of storage devices in a tangible form.

In another example, a bus system may be used to implement communications fabric 302 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 306 or a cache such as found in an interface and memory controller hub that may be present in communications fabric 302.

Figure 4:
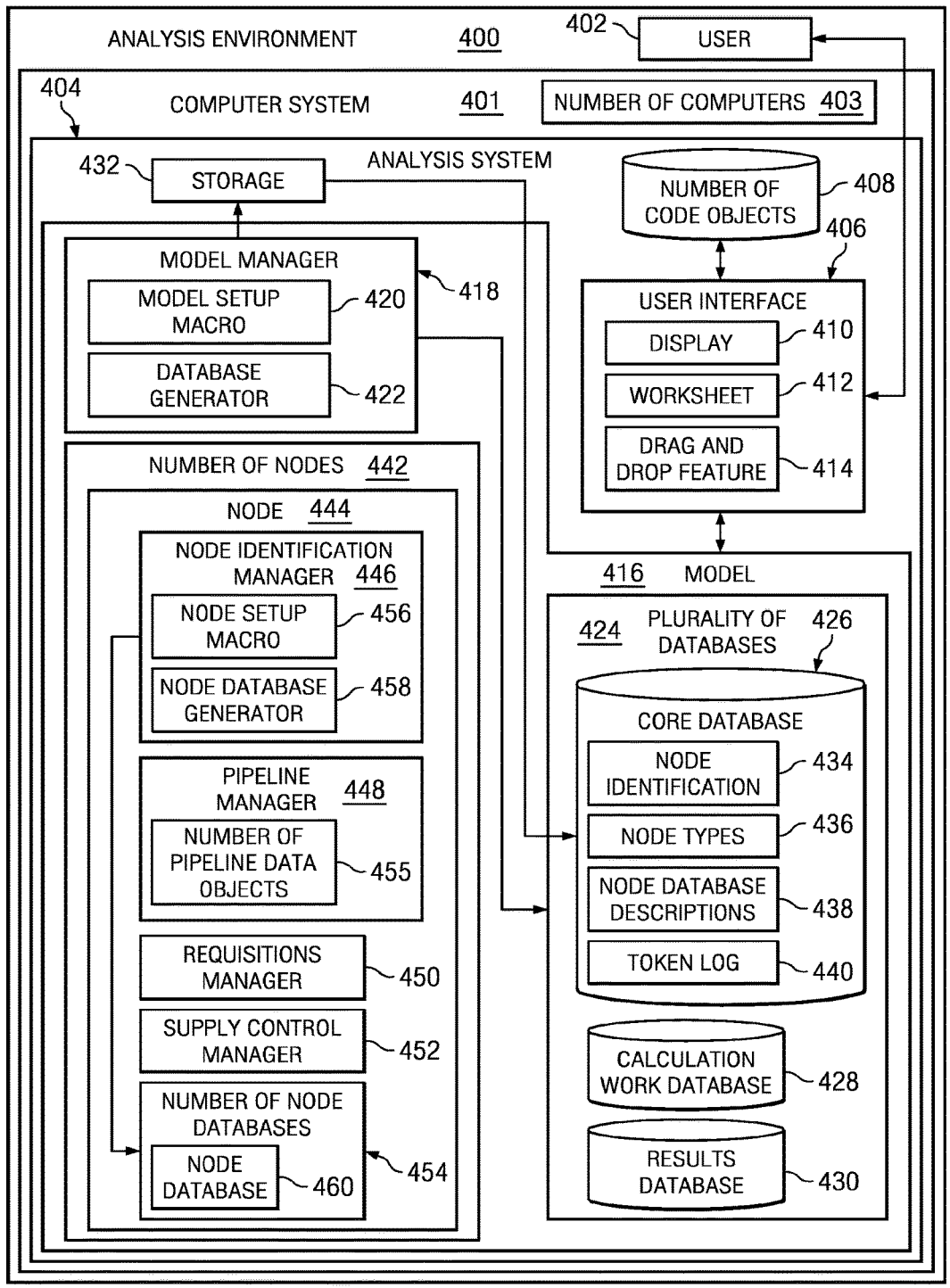
FIG. 4 is an analysis environment in accordance with an advantageous embodiment.

With reference now to FIG. 4, an analysis environment is depicted in accordance with an advantageous embodiment. Analysis environment 400 may be implemented during aircraft manufacturing and service method 100 in FIG. 1, for example. In an illustrative example, analysis environment 400 may be implemented during specification and design 102 in FIG. 1 of aircraft 200 in FIG. 2, material procurement 104, and/or routine maintenance and service 114 in FIG. 1.

Analysis environment 400 may include computer system 401. Computer system 401 may be a stand alone computer or a number of computers in a network. Computer system 401 includes number of computers 403. As used herein, "number of" refers to one or more computers. Each computer in number of computers 403 may be implemented using data processing system 300 in FIG. 3, for example.

User 402 may be, for example, without limitation, a human, intelligent agent, autonomous agent, web services, and/or any other suitable operator of analysis system 404. Analysis system 404 may be implemented using computer system 401. Analysis system 404 includes user interface 406 and number of code objects 408. User interface 406 may include display 410, worksheet 412, and drag and drop feature 414. User 402 may access number of code objects 408 via user interface 406, using drag and drop feature 414 to select and place number of code objects 408 onto worksheet 412, which generates model 416.

Model 416 represents a model constructed on worksheet 412 using number of code objects 408. Model 416 is a set of assumptions about the behavior of a system of interest, such as a supply chain network. Model 416 may take the form of mathematical or logical relationships. Model 416 is capable of running as a simulation. Number of code objects 408 is a collection of one or more fully compiled, self-contained, blocks of code. Number of code objects 408 may include auto-build macros that automatically generate data structures and/or data objects. When a code object in number of code objects 408 is selected for addition to model 416, an instance of the code object is placed into model 416. Model 416 includes model manager 418. Model manager 418 is the initial code object from number of code objects 408 selected and placed into worksheet 412. Model manager 418 includes model setup macro 420 and database generator 422.

When model manager 418 is dragged onto worksheet 412, model setup macro 420 initiates to prepare model 416 for receiving additional code objects and initiates database generator 422. Database generator 422 creates plurality of databases 424. Plurality of databases 424 may include core database 426, calculation work database 428, and results database 430. Database generator 422 imports stored text files from storage 432 to create plurality of databases 424.

Core database 426 is a global database for model 416 that is automatically generated when initializing model 416 with model manager 418. Core database 426 includes data structure definitions and parent lists for all other databases that may be generated in model 416, such as number of node databases 454. When node 444 is added to model 416, node setup macro 456 initiates to prepare node 444 for receiving additional code objects and initiates node database generator 458. Node database generator 458 automatically adds a node database to number of node databases 454 for each node generated, such as node database 460 for node 444 in this illustrative example. Each node database in number of node databases 454 includes the data structure to contain detailed information for one associated node, such as pipeline definitions, sent and received requisitions, supply release or shipments, and runtime results. A pipeline is a defined procurement relationship or strategy for replenishment of supplies. If a node is deleted from a model, such as model 416, the corresponding node database is also deleted. The definition detail for a node database is stored in core database 426. Core database 426 also includes data structures for detailed identification, status, and runtime information for each node in number of nodes 442.

Core database 426 may include node identification 434, node types 436, node database descriptions 438, token log 440, and other suitable database elements. Node identification 434 may be a table of unique node identification strings, or unique node names. Node types 436 is a list of pre-defined node types. Node database descriptions 438 includes information on database structure for nodes. Token log 440 is a list of stored tokens. A token is a data artifact created for each transaction in a simulation.

Results database 430 includes a collection of runtime node transaction records and summary results designed to be exported for post processing. Results database 430 is added with model manager 418 during initialization of model 416. The data in results database 430 is refreshed at the end of each simulation run for model 416. The definition detail for results database 430 is also stored in core database 426.

Calculation work database 428 is an exposed runtime data structure used by requisitions managers, such as requisitions manager 450, to determine how much supply is needed and from which node the supplies are to be requisitioned. Calculation work database 428 is added with model manager 418 during initialization of model 416. Individual tables are added to calculation work database 428 for each pipeline that is created within model 416 by pipeline managers, such as pipeline manager 448. The definition detail for calculation work database 428 is also stored in core database 426.

Number of nodes 442 represents unique locations where inventory assets are created, stored, sold, and/or replenished. Number of nodes 442 may be, for example, a number of inventory control points. Number of nodes 442 is a collection of one or more named objects that can be added already configured from model autobuild macros. Number of nodes 442 may be added and modified to model 416 either manually by a user, such as user 402, or automatically by a script. Each node in number of nodes 442 can be added and modified to model 416 with fully isolated objects and data constructs, without affecting other nodes in model 416. Number of nodes 442 each has a unique identification string, or name, registered by node setup macro 456 at the time of node creation with core database 426 in node identification 434. Node 444 is an illustrative example of number of nodes 442.

Node 444 includes node identification manager 446, node setup macro 456, node database generator 458, pipeline manager 448, requisitions manager 450, supply control manager 452, and number of node databases 454. Node identification manager 446, pipeline manager 448, requisitions manager 450, and supply control manager 452 may be illustrative examples of code objects from number of code objects 408 placed within node 444 using worksheet 412. Each code object within a node, such as node identification manager 446, pipeline manager 448, requisitions manager 450, and supply control manager 452 in node 444, references other node data structures within number of nodes 442 when setting and defining attributes and/or policies and when generating transactions during runtime of model 416. These attributes and policies are stored in number of node databases 454.

When a code object is selected to add to a model, the code object checks that the global and local environment is correct. If the environments are not correct, the block will not be added to the model. The global environment is the model environment, such as model 416. The local environment is the node environment, such as node 444, for example. In an illustrative example, if pipeline manager 448 is the first code object to be selected for addition to model 416, pipeline manager 448 will check the local and global environment and determine that model manager 418 is not present, and therefore pipeline manager 448 cannot be added.

In another illustrative example, if pipeline manager 448 is selected for addition to model 416 and pipeline manager 448 determines that model manager 418 is present in the global environment, but node identification manager 446 is not present in the local environment of node 444, pipeline manager 448 will not be added. In yet another illustrative example, if pipeline manager 448 is selected for addition to model 416 and pipeline manager 448 determines that model manager 418 is present in the global environment and node identification manager 446 is present in the local environment of node 444, pipeline manager 448 will be added to node 444.

When node identification manager 446, is added to model 416, node identification manager 446 locates and obtains global data structure information from core database 426. The global data structure information is used to register the local code object, such as node identification manager 446, in the global data structure. A dialog box may be presented via user interface 406 to user 402 asking for a unique node identification string, or name, and the block addition will not continue until the name entered is unique. After a unique name is entered, the dialog box may ask user 402 to select a node type from a list of pre-defined node types, such as the node types stored in node types 436 of core database 426. Node identification manager 446 then recalls a description of the required local node data structure from node database descriptions 438 of core database 426 and builds the local node data structure based on the description recalled. Node 444 may be initialized with global data structures from core database 426, with records added to core database to store indexes of node 444. In this way, each node in number of nodes 442 comprises an identical data structure.

When a node or code object is deleted from model 416, node identification manager 446 clears related node records from other node databases in number of node databases 454 and core database 426. Node identification manager 446 will also delete all local data structures for the deleted node or code object from model 416 and reset the global references for remaining nodes in number of nodes 442.

Pipelines are data objects associated with any number of nodes in a supply chain simulation, which define a procurement relationship or strategy for replenishing supplies. Each pipeline, or pipeline data object, is a data record in an expandable table of records. Each node may have an unlimited number of supply chain relationships described by pipeline data objects. Pipeline manager 448 generates number of pipeline data objects 455. Number of pipeline data objects 455 for node 444 may be stored within node database 460, for example. Number of pipeline data objects 455 is configured to specify individual supply chain relationships between number of nodes 442. A set of one or more pipeline data objects from number of pipeline data objects 455 may describe a complete supply chain network, for example. Each relationship within a supply chain network may have a different set of properties, including which parts are involved, when ordering should occur, replenishment policies, and so on. Model code objects, such as pipeline manager 448, requisitions manager 450, and supply control manager 452, for example, are configured to work with number of pipeline data objects 455.

The illustration of analysis environment 400 in FIG. 4 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, plurality of databases 424 may include additional database, such as a forecast database. A forecast database may be added when a simulation scenario is utilizing forecasts as selected as an option in model manager 418. The forecast database includes an exposed data structure that is used when populating the node forecast tables. The definition detail for the forecast database is stored in core database 426.

Figure 5:
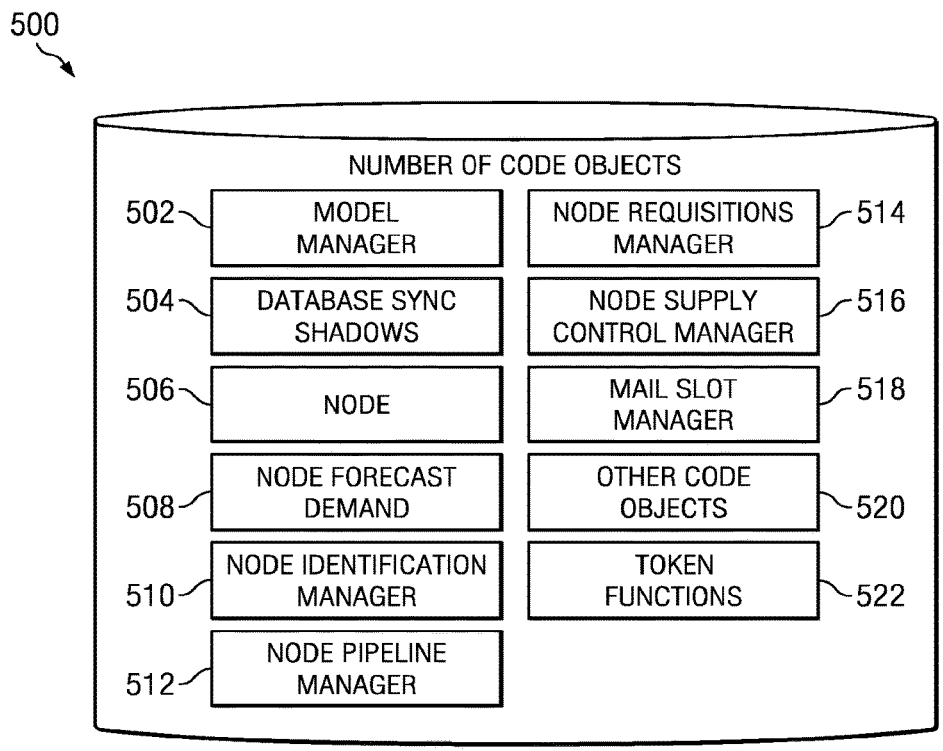
FIG. 5 is a number of code objects in accordance with an advantageous embodiment.

With reference now to FIG. 5, a number of code objects is depicted in accordance with an advantageous embodiment. Number of code objects 500 is an illustrative example of one implementation of number of code objects 408 in FIG. 4.

Number of code objects 500 may include, for example, without limitation, model manager 502, database sync shadows 504, node 506, node forecast demand 508, node identification manager 510, node pipeline manager 512, node requisitions manager 514, node supply control manager 516, mail slot manager 518, other code objects 520, token functions 522, and/or any other suitable object.

Model manager 502 is the first code object, or block, placed into a model, such as model 416 in FIG. 4. No other code objects from number of code objects 500 can be placed into a model without first having model manager 502 in the model. When model manager 502 is added, it guides the user, such as user 402 in FIG. 4, through a setup macro, such as model setup macro 420 in FIG. 4.

Database sync shadows 504 is a code object that maintains common, or parent, type and list tables between databases by identifying one database as the core database. Database sync shadows 504 synchronizes all common fields between core database tables and identical shadow tables in all other databases.

Node 506 is unique location where inventory assets are created, stored, sold, and replenished. Node 506 may be referred to, for example, as an inventory control point in a supply chain modeling simulation.

Node forecast demand 508 is an optional code object designed to support models that are driven by forecast tables. Node forecast demand 508 can function as a simple top-level demand block during runtime, plus support multi-tiered forecast models by automating the task of building lower tier forecast tables based on pipeline definitions. Node forecast demand 508 is used in models where a forecast tables option was selected in model manager 502 during the setup macro.

Node identification manager 510 is the first block required to be placed in a node. When node identification manager 510 is added, it sets off a setup macro that creates a node database. Node identification manager 510 provides other node blocks, such as node pipeline manager 512, node requisitions manager 514, and node supply control manager 516, with identification parameters needed during configuration and runtime.

Node pipeline manager 512 provides the dialog used to configure and modify pipelines within a model. Node pipeline manager 512 maintains database pipeline tables and records to store information about each pipeline in a node. A pipeline is a defined procurement relationship or strategy for replenishment of supplies.

Node requisitions manager 514 is a runtime block that takes the timing, rules, and supply position calculations configured in each pipeline and releases replenishment requisitions based on the results. These transactions are recorded by node requisitions manager 514 in the local node database.

Node supply control manager 516 is a runtime block that takes requisitions received by the node and releases available supplies, or shipments. Node supply control manager 516 also receives supplies that are arriving at the node. Node supply control manager 516 records supply release and deliveries in the local node database.

Mail slot manager 518 is an optional messaging code object for custom model constructs that surround a model. Other code objects 520 may include statistics, needs repair logger, preconfigured node modules, and/or any other suitable code objects.

Token functions 522 provide a way of exposing communications between model entities, such as code objects, via the database so that the communications are more visible and can be operated on directly. Token functions 522 include generic properties that allow for unlimited number of custom logics for supply chain related decisions. Token functions 522 are stored in a token log of the core database, such as token log 440 in FIG. 4, during runtime. Token functions 522 can initiate different behaviors in the model depending upon the token type and token mode, discussed in more detail in FIG. 6.

The illustration of number of code objects 500 in FIG. 5 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 6:
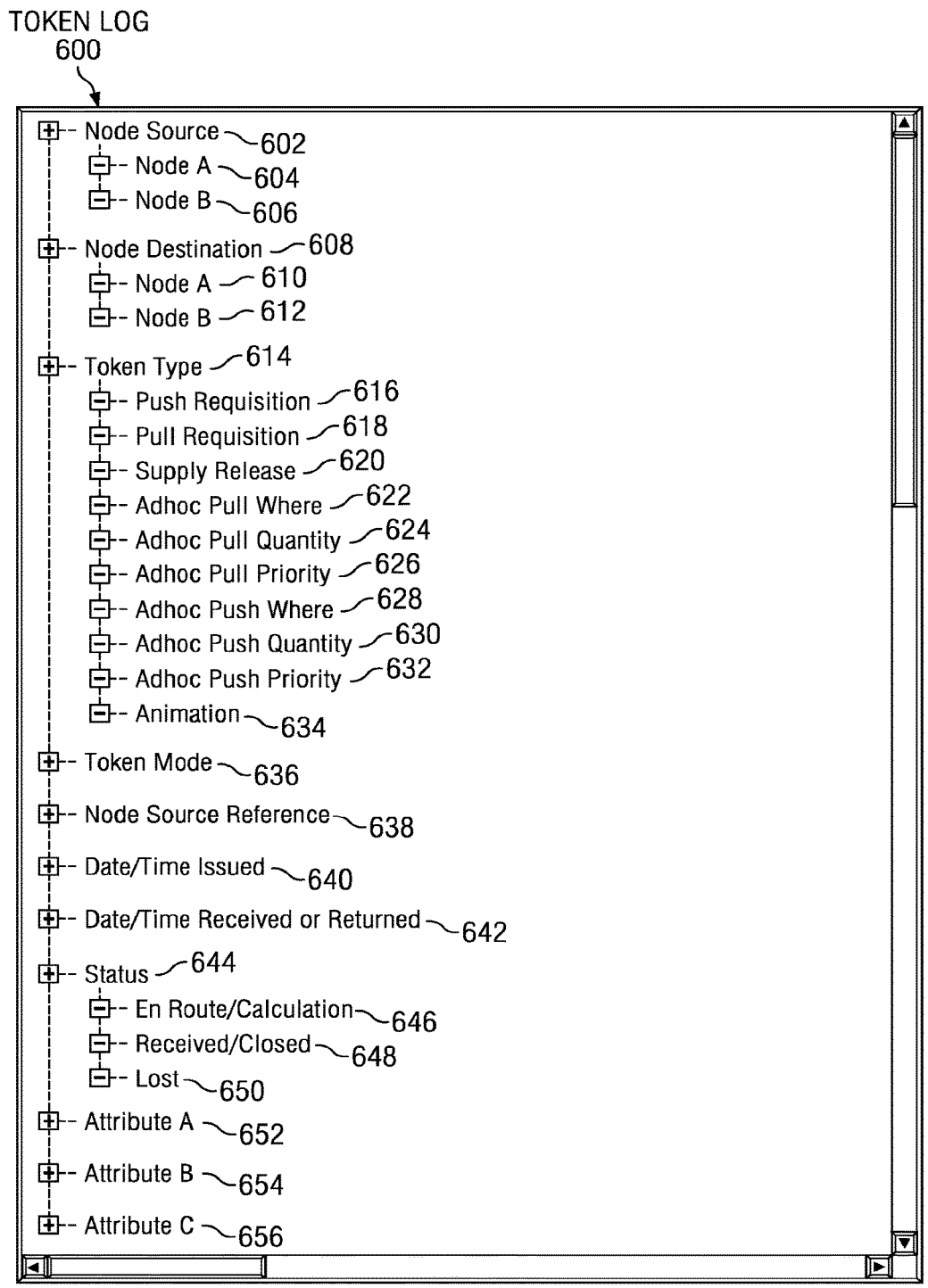
FIG. 6 is a token log in accordance with an advantageous embodiment.

With reference now to FIG. 6, a token log is depicted in accordance with an advantageous embodiment. Token log 600 is an illustrative example of one implementation of token log 440 in FIG. 4.

Token log 600 includes data object attributes that describe the purpose and function of a given token. Node source 602 lists possible nodes a token may have initiated from, such as node A 604 and/or node B 606. Node destination 608 lists possible nodes a token may be intended for, such as node A 610 and/or node B 612. In one advantageous embodiment, node A 604 and node B 606 may be the same node.

Token type 614 lists different types of tokens that may be generated, such as push requisition 616, pull requisition 618, supply release 620, adhoc pull where 622, adhoc pull quantity 624, adhoc pull priority 626, adhoc push where 628, adhoc push quantity 630, adhoc push priority 632, animation 634, and/or any other suitable type of token. Each token's objective and intended use may be described in a data record stored in the core database, for example.

Push requisition 616 notifies a receiver of impending shipment of pushed parts. Push is a requisition type that describes one node sending supplies to other nodes or a local assembly/refurbish resource based on the sending node's local inventory position. Pull requisition 618 notifies a vendor of an order for parts. Pull is a requisition type that describes one node requesting supplies from another node or a local assembly/refurbish resources based on the receiving node's local inventory positions. Supply release 620 sends parts to a receiver, such as a shipment to fulfill an order or request for supplies.

Adhoc is a requisition type that dynamically determines the replenishment source and/or quantity during runtime. An internal adhoc requisition uses a predefined list of adhoc types stored in a pipeline dialog generated by a pipeline manager, such as pipeline manager 448 in FIG. 4, for example. An external adhoc requisition releases a token into custom modeling constructs to determine the replenishment source, priority, delivery delay and/or quantity of supplies needed. Adhoc pull where 622 calculates where an order is originating from. Adhoc pull quantity 624 calculates a quantity to order. Adhoc pull priority 626 calculates an order priority. Adhoc push where 628 calculates where to send pushed parts. Adhoc push quantity 630 calculates a quantity of pushed parts to send. Adhoc push priority 632 calculates a priority of pushed parts. Animation 634 triggers an animation to go with a supply release.

Token mode 636 may describe a mode for a token. The token mode is a reference for the runtime messaging method that was utilized to release and/or communicate the token.

Node source reference 638 indicates which node is the source node for the token. Date/Time issued 640 provides a reference date and time for the token issue. Date/Time received or returned 642 provides a reference date and time for completion of the token. Status 644 describes the status of a particular token, such as en route/calculation 646, received/closed 648, lost 650, and/or any other suitable token status.

Attribute A 652, attribute B 654, attribute 656 are context dependent data files that may be used to store data related to tokens.

The illustration of token log 600 in FIG. 6 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 7:
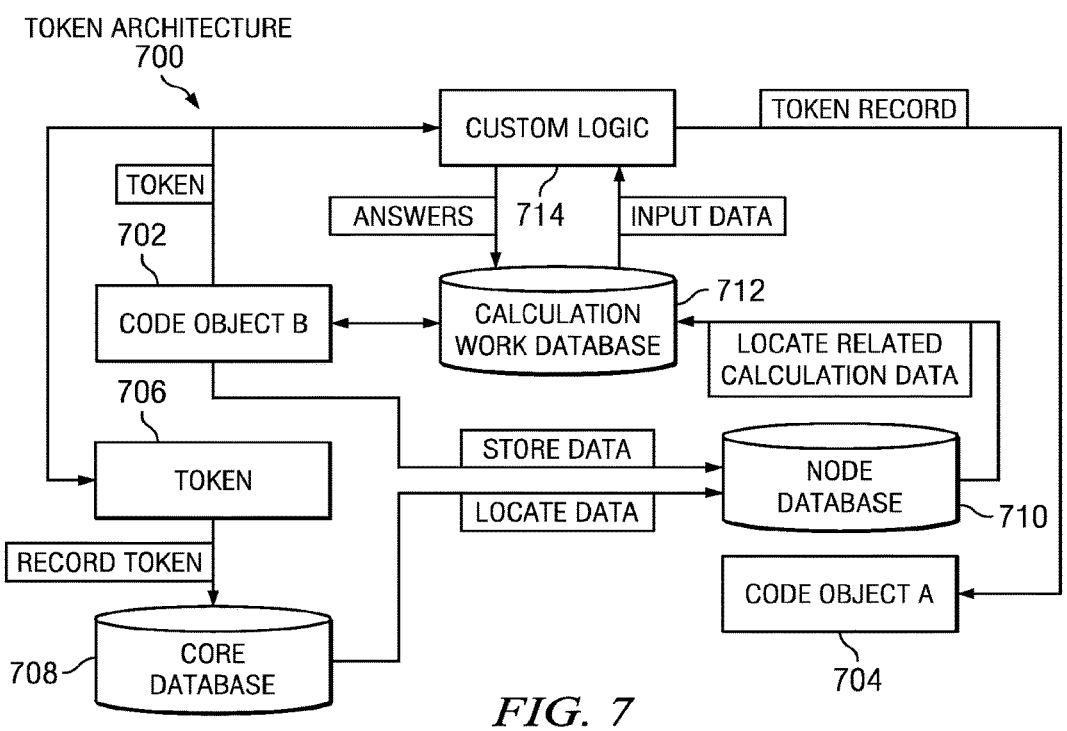
FIG. 7 is a token architecture in accordance with an advantageous embodiment.

With reference now to FIG. 7, a token architecture is depicted in accordance with an advantageous embodiment. Token architecture 700 is an illustrative example of the relationship between tokens and code objects in analysis environment 400 of FIG. 4.

Token architecture 700 may include code object B 702 and code object A 704. Code object B 702 and code object A 704 are illustrative examples of one implementation of number of code objects 408 in FIG. 4. In this illustrative example, code object B 702 has a need to send data or pass control to another model object, such as code object A 704. In one illustrative example, code object B 702 may be a supply control manager that needs to ship an order to another node, such as code object A 704.

In this illustrative example, token 706 is generated and stored in core database 708 for access by the model. Token attributes for token 706 specify which model object sent the token, which model object is meant to receive token 706, and where related data is stored in node database 710 and calculation work database 712.

If custom logic 714 is invoked to more fully describe the behavior being modeled, the token mode for token 706 is set to "local con out" or "mail slot," which pass the token record identification information to the custom code the user provides. When the user provided custom logic 714 receives the new token record identification number, custom logic 714 can look up specific attributes of token 706 in core database 708.

Node database 710 includes data needed for user provided custom logic 714 to execute. This data is context sensitive data which depends on the type, or purpose, of token 706. For example, data in the supply release table may indicate how many items need to be shipped for a particular order.

Calculation work database 712 stores results of custom logic 714 needed by the receiving model object, in this example code object A 704. When custom logic 714 completes its calculations, custom logic 714 passes token record identification information to code object A 704. Code object A 704 then kicks off baseline functionality associated with receiving a token of that type, such as putting parts in inventory for example. If additional calculated data is required to complete baseline functionality, code object A 704 can locate that data in calculation work database 712.

The illustration of token architecture 700 in FIG. 7 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 8:
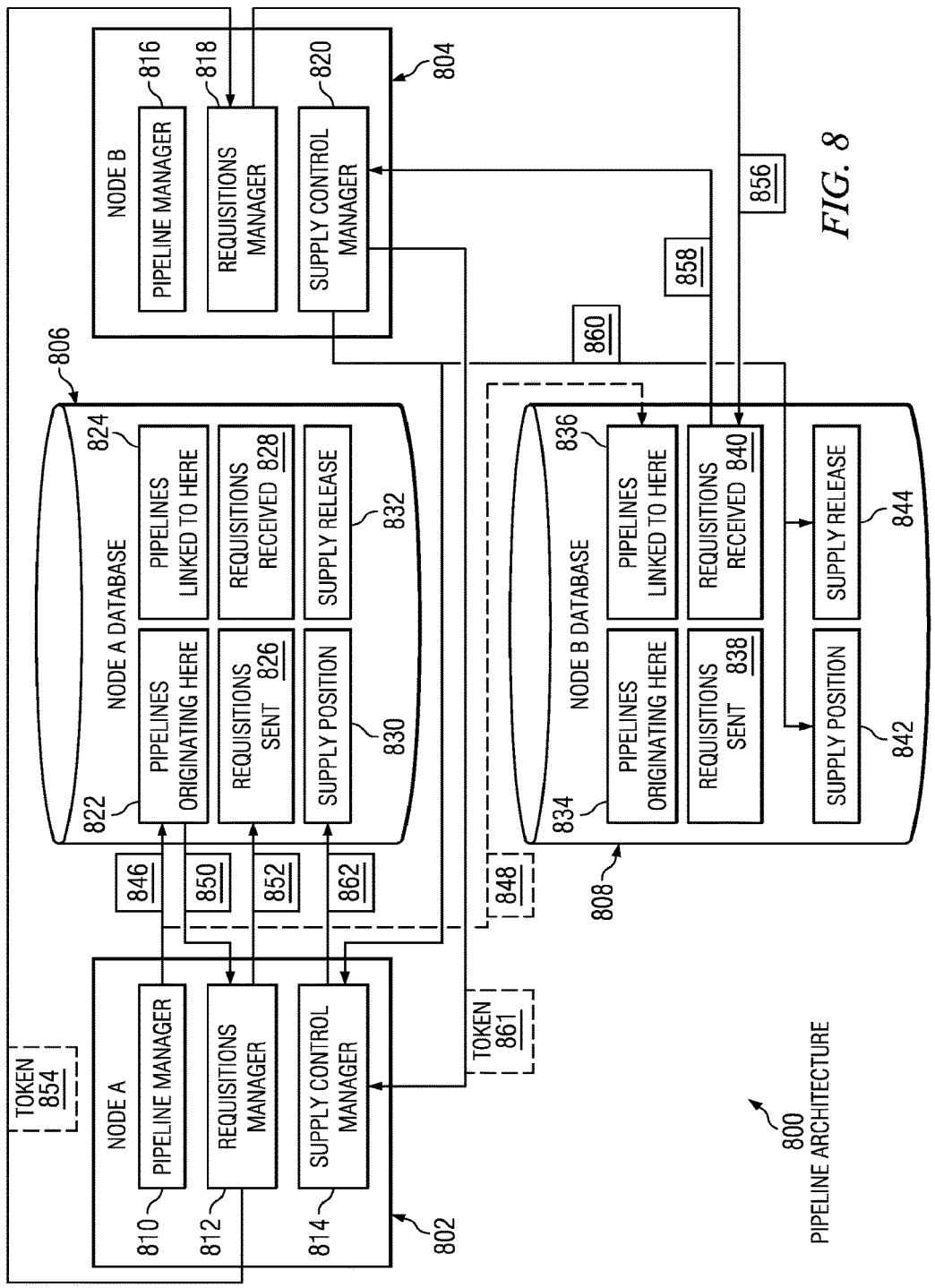
FIG. 8 is a pipeline architecture in accordance with an advantageous embodiment.

With reference now to FIG. 8, a pipeline architecture is depicted in accordance with an advantageous embodiment. Pipeline architecture 800 is an illustrative example of the relationship between data objects and code objects in analysis environment 400 of FIG. 4.

Pipelines are data objects associated with any number of nodes in a supply chain simulation, which define a procurement relationship or strategy for replenishing supplies. Each pipeline is a data record in an expandable table of records. Each node may have an unlimited number of supply chain relationships described by pipeline data objects. A pipeline data object, such as number of pipeline data objects 455 in FIG. 4 for example, is configured to specify individual supply chain relationships between nodes, such as number of nodes 442 in FIG. 4. A set of pipeline data objects, such as number of pipeline data objects 455 in FIG. 4, may describe a complete supply chain network. Each relationship may have a different set of properties, including which parts are involved, when ordering should occur, replenishment policies, and so on. Model code objects, such as pipeline manager 448, requisitions manager 450, and supply control manager 452 in FIG. 4, for example, are configured to work with pipeline data objects.

In an illustrative example, requisitions manager 450 in FIG. 4 is configured to generate requisitions for parts at the appropriate times in the simulation in accordance with rules defined by each pipeline. The segregation of pipeline attributes from requisitions manager 450 in FIG. 4 enables requisitions manager 450 to be generic and identical between each node in a model, such as node A 802 and node B 804, for example. The data that describes the supply relationships may change dynamically, but the node and the code objects within a node may be static and reusable. Changing the supply chain network is also straightforward, accomplished by editing the pipeline relationships.

In this illustrative example of pipeline architecture 800, there are two nodes, node A 802 and node B 804, each with their own local database. When node A 802 and node B 804 are created in the model, such as model 416 in FIG. 4, the associated node A database 806 and node B database 808 are also created. Node A database 806 is the local database for node A 802. Node B database 808 is the local database for node B 804. Each local database provides tables for describing pipelines that are defined for the local node. For example, node A database 806 includes tables describing pipelines that are defined for node A 802. These tables are empty until a pipeline is defined using either a user interface, such as user interface 406 in FIG. 4, or a script.

Node A 802 includes pipeline manager 810, requisitions manager 812, and supply control manager 814. Pipeline manager 810, requisitions manager 812, and supply control manager 814 are illustrative examples of one implementation of number of code objects 408 in FIG. 4. Node B 804 includes pipeline manager 816, requisitions manager 818, and supply control manager 820.

Pipeline manager 810 and pipeline manager 816 are configured to create, modify, and delete pipelines in order to describe supply chain relationships. When a new pipeline is created, the pipeline manager for the source node adds a record to the node database of the source node. If the pipeline specifies a static link to a partner node, the pipeline manager for the partner node adds a reference to the source node in the node database of the partner node. This enables each node in a supply chain simulation to have knowledge of which other nodes the node has a supply replenishment relationship with in the model.

Requisitions manager 812 and requisitions manager 818 are configured to work with defined pipelines to post orders for parts. The requisitions manager evaluates inventory status at the timing specified in the pipeline definition. The parts to order, if any, are calculated by the requisitions manager according to the policies described by each pipeline.

Supply control manager 814 and supply control manager 820 are configured to receive requisitions and release available supplies. If a supply is not available, the supply control manager will increment a "supply current requisitions" field in the local node database supply position table to document the backlog. New supplies cannot be ordered until an appropriate pipeline is evaluated to decide to order the replenishment parts. The supply control manager also receives incoming shipments and increments local inventory accordingly.

Each local database includes a number of tables and information about pipelines, nodes, and the relationship between nodes. Node A database 806 includes pipelines originating here 822, pipelines linked to here 824, requisitions sent 826, requisitions received 828, supply position 830, and supply release 832. Pipelines originating here 822 is a table describing each supply relationship initiated by node A 802. When a new pipeline is generated by pipeline manager 810 of node A 802, the pipeline is recorded in pipelines originating here 822. Pipelines originating here 822 is referenced by requisitions manager 812 during runtime.

Pipelines linked to here 824 is a reference table of each supply relationship linked to node A 802 but originating from a node other than node A 802. Requisitions sent 826 is a table of orders or requests for supplies originating from node A 802. These orders or requests can be between different nodes, or within the same node if assembling or refurbishing supplies, for example. Requisitions received 828 is a table of orders or requests for supplies received by node A 802. Supply position 830 tracks the state of supplies within node A 802. All supplies are tracked in one of two states, a fully functional supply that is known as "supply" and the same non-functioning supply inventoried as "needs repair." Supply position 830 also tracks the quantity of supplies in inventory at node A 802. Supply release 832 is a table tracking the shipment or release of supplies from node A 802.

Node B database 808 includes pipelines originating here 834, pipelines linked to here 836, requisitions sent 838, requisitions received 840, supply position 842, and supply release 844.

Supply chain relationships may be defined by creating pipeline data objects. This definition can be performed via a user interface provided by the pipeline model object, such as user interface 406 in FIG. 4, for example. The user interface allows for the creation, modification, and deletion of pipelines in a model. However, since the data that describes each pipeline is entirely contained in each node's local data, pipeline architecture 800 is also capable of creating pipelines via automation.

In this illustrative example, pipeline manager 810 in node A 802 creates pipeline 846. Pipeline 846 is recorded in pipelines originating here 822. New link 848 is created between node A 802 and node B 804 and recorded in pipelines linked to here 836 of node B database 808. Pipeline 846 includes a definition specifying the simulation times at which pipeline 846 should be evaluated for possible creation of a supply requisition. Definition 850 is referenced by requisitions manager 812 from pipelines originating here 822.

Requisitions manager 812 is capable of evaluating the local supply position of node A 802 in accordance with definition 850. Requisitions manager 812 generates supply requisition 852 and transmits order 852 to a vendor node, such as node B 804 in this example. The transfer of the order from node A 802 to node B 804 is accomplished via token 854. Node B requisition manager 818 receives token 854 and processes order 852. Supply requisition 852 is recorded in requisitions sent 826 of node A database 806.

Requisitions manager 818 receives token 854 and records requisition 856 in requisitions received 840. Supply control manager 820 monitors requisitions received 840 and pulls requisition received 858 to attempt to fill orders with parts in node B 804 inventory. When the order is capable of being filled, supply control manager 820 sends shipment 860 to supply control manager 814 of node A 802. Supply control manager 820 records shipment 860 in supply release 844 of node B database 808, and decrements local inventory accordingly in supply position 842. Supply control manager 820 sends token 861 to supply control manager 814 indicating a shipment has been released. Supply control manager 814 of node A 802 receives shipment 860 and sends update 862 to supply position 830 to increment local inventory accordingly.

The illustration of pipeline architecture 800 in FIG. 8 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 9:
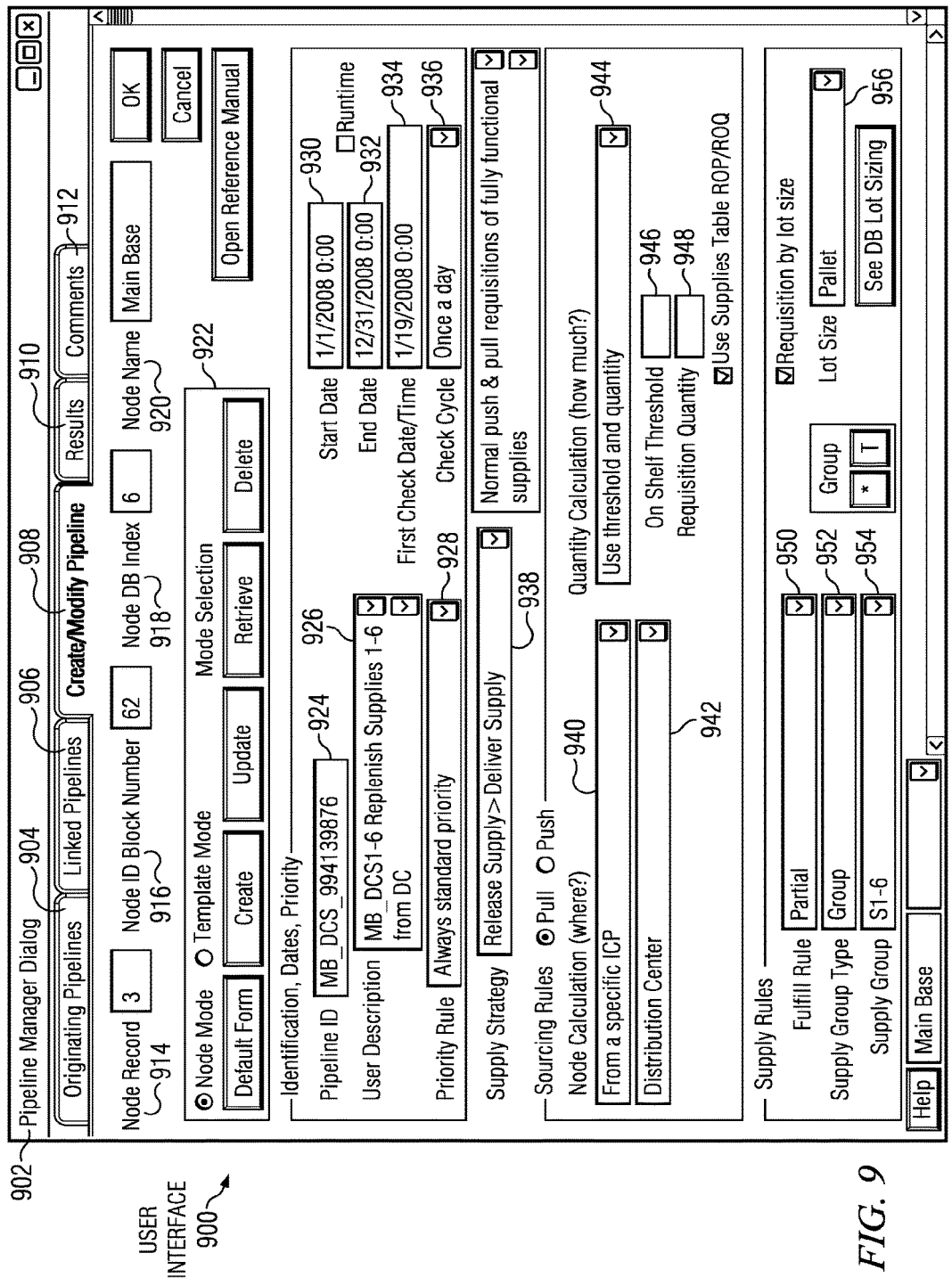
FIG. 9 is a user interface in accordance with an advantageous embodiment.

With reference now to FIG. 9, a user interface is depicted in accordance with an advantageous embodiment. User interface 900 is an illustrative example of one implementation of user interface 406 in FIG. 4. User interface 900 depicts pipeline manager dialog 902 in this illustrative example. Pipeline manager dialog 902 may run in response to addition of pipeline manager 448 to model 416 in FIG. 4, for example. Pipeline manager dialog 902 may also be pulled up during a simulation to create, modify, or delete a pipeline.

Pipeline manager dialog 902 depicts tabs including originating pipelines 904, linked pipelines 906, create/modify pipelines 908, results 910, and comments 912. Originating pipelines 904 provides access to a pipelines originating here database table, such as pipelines originating here 822 in FIG. 8, for example. Linked pipelines 906 provides access to a pipelines linked to here database table, such as pipelines linked to here 824 in FIG. 8. Create/modify pipelines 908 provides configurable options to create, modify, or delete a pipeline. Results 910 provides a window to output statistics gathered for all pipelines originated by the node associated with pipeline manager dialog 902. Comments 912 is a place for an analyst, such as user 402 in FIG. 4, to place configuration notes.

In this illustrative example, create/modify pipelines 908 is selected. Node record 914, node ID block number 916, node database index 918, and node name 920 are each read-only parameters that reveal the registration values and name for the node. Mode selection 922 allows a user, such as user 402 in FIG. 4, to select the type of pipeline that is being saved with actionable macro buttons. The type of pipeline may be, for example, without limitation, a template or a node.

Pipeline ID 924 is a read-only parameter that reveals the unique string identification assigned to the pipeline when it is created. User Description 926 allows a user to input relevant notes to the pipeline definition. Priority rule 928 is an input selection for setting the priority of requisitions, with higher priority requisitions being serviced first. Start Date 930 sets the runtime calendar date when the requisitions manager begins evaluation. The start date for the pipeline evaluation can be further adjusted by the First Check Date/Time 934 which provides increased precision for the Cycle Check 936 setting. Cycle Check 936 sets the amount of simulation time that will pass between requisition manager evaluations of the pipeline. For example, cycle check 936 may provide options such as, without limitation, once a day, once a week, once a month, and/or any other suitable amount of time. End Date 932 sets the runtime calendar date when the requisitions manager stops evaluation. Supply Strategy 938 is a selection of a single high-level replenishment strategy being defined. The selection of a supply strategy 938 in combination with the Sourcing Rule Selection of Pull or Push covers the core matrix of replenishment relationships that are defined in supply chain simulations. In this example Supply Strategy 938 has been set to a Release Supply, Deliver Supply strategy and the sourcing rule has been selected as Pull. This combination then reveals to user inputs 940, 942, 944, 946, and 948 for setting Node Calculation 940 and 942 and Quantity Calculation 944 and 946. This section of the input refers to rules and policies that the requisition manager will follow as it evaluates the pipeline and releases runtime requests for replenishment. If a alternative Supply Strategy 938 and/or Sourcing Rule had been select, the node calculation and quantity calculation input options revealed may have been different.

Similarly, the example quantity calculation 944 is set to Use threshold and quantity, which further revealed input options On-shelf threshold 946 and Requisition Quantity 948. If an alternative Quantity Calculation 944 had been selected, other input options may have been revealed. Supply Rules 950, 952, 954, and 956 further set replenishment policies for the pipeline. Fulfill rule 950 identifies how the supplies may be grouped for shipment, such as one shipment or many shipments, for example. Supply group type 952 and supply group 954 specifically identifies the number of supplies that are evaluated with this pipeline definition. Lot size 956 allows implementation of a minimum order rule which will adjust the result of Quantity Calculation 944.

The illustration of user interface 900 in FIG. 9 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 10:
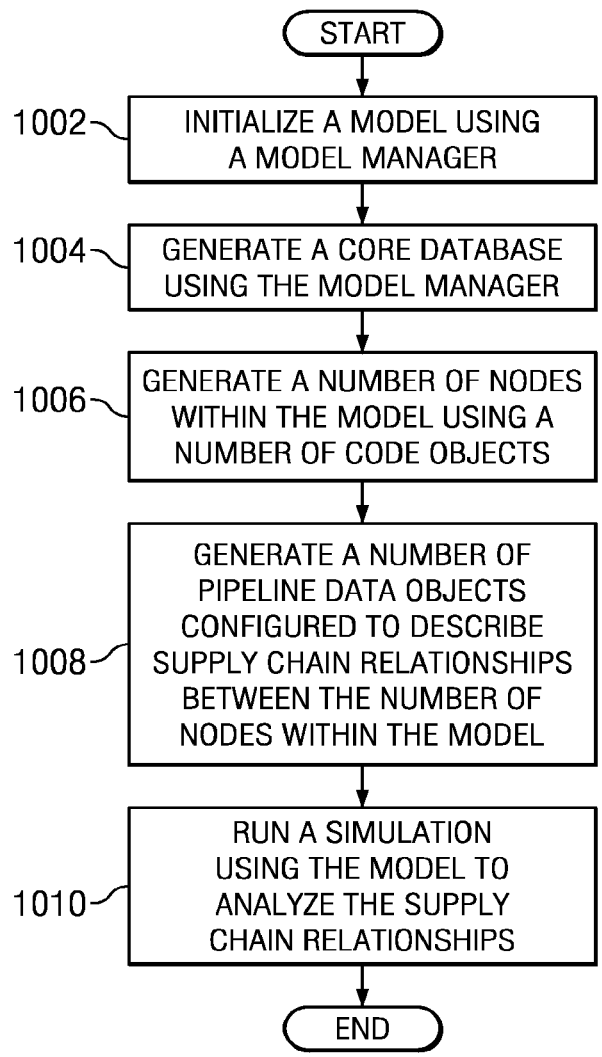
FIG. 10 is a flowchart illustrating a process for modeling supply chain networks in accordance with an advantageous embodiment.

With reference now to FIG. 10, a flowchart illustrating a process for modeling supply chain networks is depicted in accordance with an advantageous embodiment. The process in FIG. 10 may be implemented by a component such as analysis system 404 in FIG. 4, for example.

The process begins by initializing a model using a model manager (operation 1002). The process generates a core database using the model manager (operation 1004). Generating the core database may include, for example, importing a text file from a storage device of the system, such as storage 432 in FIG. 4. The process generates a number of nodes within the model using a number of code objects (operation 1006). The number of code objects are fully compiled, self-contained, blocks of code having a number of auto-build macros, such as number of code objects 408 in FIG. 4, for example. Generating the number of nodes may further include locating and obtaining global data structure information and a description of a local node data structure from the core database to build a local node data structure, for example. A node database referencing the node descriptions stored in the core database may be generated for each of the number of nodes generated within the model during this process. A messaging system may be provided between the number of code objects within the model to communicate ordering and replenishment events using a token architecture, for example.

The process generates a number of pipeline data objects configured to describe supply chain relationships between the number of nodes within the model (operation 1008). The number of pipeline data objects each specify individual supply chain relationships between nodes. A set of pipeline data objects may describe a complete supply chain network, for example. The process runs a simulation using the model to analyze the supply chain relationships (operation 1010), with the process terminating thereafter.

During a simulation, the model may generate a request for supplies using a requisition manager and receive the supplies according to the request for the supplies using a supply control manager, for example. In another example, the model may receive a request for supplies using the requisitions manager and send the supplies according to the request using a supply control manager.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W) and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation to keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters are just a few of the currently available types of communications adapters.

The different advantageous embodiments recognize and take into account a number of different considerations. For example, the different advantageous embodiments recognize and take into account that current tools for modeling supply chain performance generally are purchased from a vendor, operate at less level of detail than desired, and typically focus on inventory stocking level optimization. Some current tools use a multi-step, iterative, marginal analysis procedure to determine optimum stocking levels. Other current tools use risk-based algorithms and forecasting to determine optimum stocking levels. Still other current tools use mixed-integer/linear programming combined with a proprietary discrete-event simulation engine to determine optimum stocking levels.

The different advantageous embodiments further recognize and take into account that current tools use analytical methods to solve inventory optimization problems and provide guidance as to recommended inventory levels. These current tools have a high product cost, are complex and time-intensive to set up and execute, and have limited or non-existing capabilities to model non-supply chain specific aspects of a total system architecture.

The different advantageous embodiments further recognize and take into account that current supply chain modeling tools are expensive and complex to set up and run, and lack the capability to easily expand the scope of the model to model lower level details about a system design. These limitations create burdens for concept analysts, system engineers, and logistics analysts, who may need to construct a model to analyze and predict supply chain performance, while also addressing aspects of the system impacted by the supply chain, such as maintenance requirements, resource requirements, manufacturing requirements, transportation system design requirements, and the like.

Thus, the different advantageous embodiments provide a system that offers program analysts, systems engineers, and logistics/supply chain experts the ability to rapidly develop accurate, efficient, high fidelity simulations of supply chain and logistics networks. The different advantageous embodiments provide a reusable supply chain modeling capability to support inventory management assessment, performance-based logistics contracts risk assessment, and manufacturing schedule risk assessment. This system meets a need within a company for a supply chain and logistics modeling capability that can be applied across multiple programs, provides detailed output at the individual parts level, and can interface to other company logistics and performance analysis tools. The different advantageous embodiments provide a system that reduces the time and costs required to develop supply chain network simulations, makes it easier to model overall system operational availability as a function of supply chain performance, and provides a modeling architecture that can easily be expanded to add additional fidelity as needed at minimal cost.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A non-transitory computer system embodied as a non-transitory computer-readable medium for modeling supply chain networks for real aircraft, the system comprising:
   a model manager configured to initialize a model, the model comprising a set of mathematical or logical relationships describing a behavior of a supply chain network;
   a node identification manager configured to initialize a number of nodes within the model, wherein each of the number of nodes is a corresponding description within the model of a corresponding unique physical location where corresponding inventory assets, comprising services or physical objects, are created stored, sold, and replenished, and wherein the number of nodes comprises at least two nodes;
   a pipeline manager configured to generate a number of pipeline data objects, wherein each pipeline data object corresponds to and is associated with a corresponding node, wherein each pipeline data object is one of: a corresponding defined procurement relationship between the corresponding node and at least one other node in the model, or a corresponding strategy for replenishment of supplies for the corresponding node, wherein each pipeline data object is a data record in an expandable table of records, and wherein each data record is a table describing each corresponding defined procurement relationship or corresponding strategy for the corresponding node, wherein the pipeline manager is further configured to generate the number of pipeline data objects by using non-supply chain aspects of a total system architecture, wherein the non-supply chain aspects include at least predicting maintenance requirements for individual aircraft in the supply chain networks; and
   a supply control manager configured to send and receive the inventory assets according to requests for supplies, wherein the supply control manager is further configured to use ones of the number of pipeline data objects in determining sending and receiving of the corresponding inventory assets.

2. The non-transitory computer system of claim 1 further comprising:
   a requisitions manager configured to generate and receive requests for supplies from among any of the corresponding inventory assets.

3. The non-transitory computer system of claim 1 further comprising:
   a core database generated during initialization of a model by the model manager, the core database having a number of data structure definitions and parent lists for a number of databases.

4. The non-transitory computer system of claim 1 further comprising:
   a token architecture configured to interface with user provided custom logic to interact with a number of code objects within the model, wherein the number of code objects remain unchanged by the custom logic.

5. The non-transitory computer system of claim 1 further comprising:
   a user interface having a drag and drop feature configured to provide a user access to a number of code objects for the model.

6. The non-transitory computer system of claim 5, wherein the number of code objects are fully compiled, self-contained, blocks of code having a number of auto-build macros.

7. The non-transitory computer system of claim 1, wherein the model manager further comprises:
a model setup macro configured to generate a model having a core database; and
a database generator configured to generate the core database by importing a text file from a storage device of the system.

8. The non-transitory computer system of claim 1, wherein the node identification manager further comprises:
a node setup macro configured to locate and obtain global data structure information and a description of a local node data structure from a core database to build a local node data structure; and
a database generator configured to generate a node database referencing the node descriptions stored in the core database.

9. The non-transitory computer system of claim 8, wherein the node identification manager is a first code object required by a node in order to add the pipeline manager.

10. The non-transitory computer system of claim 1, wherein each node in the number of nodes has a corresponding node database in a number of node databases.

11. The non-transitory computer system of claim 1 further comprising:
a token architecture configured to provide a messaging system between a number of code objects within the model to communicate ordering and replenishment events.

12. A method for operating a supply chain network for real aircraft, the method comprising:
initializing a model using a model manager, the model comprising a set of mathematical or logical relationships describing a behavior of the supply chain network;
generating a core database using the model manager;
generating a number of nodes within the model using a number of code objects, wherein each of the number of nodes is a corresponding description within the model of a corresponding unique physical location where corresponding inventory assets, comprising services or physical objects, are created stored, sold, and replenished, and wherein the number of nodes comprises at least two nodes;
generating a number of pipeline data objects configured to describe supply chain relationships between the number of nodes within the model, wherein each pipeline data object corresponds to and is associated with a corresponding node, wherein each pipeline data object is one of: a corresponding defined procurement relationship between the corresponding node and at least one other node in the model, or a corresponding strategy for replenishment of supplies for the corresponding node, wherein each pipeline data object is a data record in an expandable table of records, and wherein each data record is a table describing each corresponding defined procurement relationship or corresponding strategy for the corresponding node, wherein a pipeline manager generates the number of pipeline data objects by using non-supply chain aspects of a total system architecture, wherein the non-supply chain aspects include at least predicting maintenance requirements for individual aircraft in the supply chain networks; and
sending and receiving, using a supply control manager, the inventory assets according to requests for supplies, wherein the supply control manager is further configured to use ones of the number of pipeline data objects in determining sending and receiving of the corresponding inventory assets.

13. The method of claim 12 further comprising:
using the model and the number of pipeline data objects to analyze the supply chain relationships, wherein an analysis is formed.

14. The method of claim 12 further comprising:
locating and obtaining global data structure information and a description of a local node data structure from the core database to build a local node data structure.

15. The method of claim 12 further comprising:
providing a messaging system between the number of code objects within the model to communicate ordering and replenishment events using a token architecture.

16. A computer comprising:
a processor;
a bus connected to the processor; and
a non-transitory computer-readable medium connected to the bus and storing program code which, when executed by the processor, performs a method for modeling supply chain networks for real aircraft, the program code comprising:
program code for initializing a model using a model manager, the model comprising a set of mathematical or logical relationships describing a behavior of a supply chain network;
program code for generating a core database using the model manager;
program code for generating a number of nodes within the model using a number of code objects, wherein each of the number of nodes is a corresponding description within the model of a corresponding unique physical location where corresponding inventory assets, comprising services or physical objects, are created stored, sold, and replenished, and wherein the number of nodes comprises at least two nodes;
program code for generating a number of pipeline data objects configured to describe supply chain relationships between the number of nodes within the model, wherein each pipeline data object corresponds to and is associated with a corresponding node, wherein each pipeline data object is one of: a corresponding defined procurement relationship between the corresponding node and at least one other node in the model, or a corresponding strategy for replenishment of supplies for the corresponding node, wherein each pipeline data object is a data record in an expandable table of records, and wherein each data record is a table describing each corresponding defined procurement relationship or corresponding strategy for the corresponding node, wherein a pipeline manager is configured to generate the number of pipeline data objects by using non-supply chain aspects of a total system architecture, wherein the non-supply chain aspects include at least predicting maintenance requirements for individual aircraft in the supply chain networks;
program code for generating a request for supplies using a requisitions manager from among any of the corresponding inventory assets;
program code for receiving the supplies according to the request for the supplies using a supply control manager, wherein the supply control manager is further configured to use ones of the number of pipeline data objects in determining receiving of the inventory assets.

17. The computer of claim 16, wherein the program code further comprises:
program code for generating a node database referencing the node descriptions stored in the core database for each of the number of nodes generated within the model.

18. The computer of claim 16, wherein the program code further comprises:
program code for providing a messaging system between the number of code objects within the model to communicate ordering and replenishment events using a token architecture.

* * * * *